United States Patent
Kamath

(10) Patent No.: US 7,560,962 B2
(45) Date of Patent: Jul. 14, 2009

(54) GENERATING AN OUTPUT SIGNAL WITH A FREQUENCY THAT IS A NON-INTEGER FRACTION OF AN INPUT SIGNAL

(75) Inventor: Anant Shankar Kamath, Bangalore (IN)

(73) Assignee: Texas Instruments Incorporated, Dalas, TX (US)

( * ) Notice: Subject to any disclaimer, the term of this patent is extended or adjusted under 35 U.S.C. 154(b) by 196 days.

(21) Appl. No.: 11/609,347

(22) Filed: Dec. 12, 2006

(65) Prior Publication Data

US 2008/0136471 A1 Jun. 12, 2008

(51) Int. Cl.
H03L 7/06 (2006.01)

(52) U.S. Cl. .......................... 327/158; 331/16; 377/48; 327/115

(58) Field of Classification Search ................. 327/158; 331/16; 377/48
See application file for complete search history.

(56) References Cited

U.S. PATENT DOCUMENTS

| | | | | |
|---|---|---|---|---|
| 6,157,694 A | * | 12/2000 | Larsson | 377/48 |
| 6,642,800 B2 | * | 11/2003 | Drapkin et al. | 331/16 |
| 6,807,552 B2 | * | 10/2004 | Bredin et al. | 708/103 |
| 6,845,462 B2 | | 1/2005 | Yatsuda et al. | |
| 7,298,218 B2 | * | 11/2007 | Ghazali et al. | 331/16 |

OTHER PUBLICATIONS

Tom A. D. Riley, Miles A. Copeland, Fellow, and Tad A. Kwasniewski, "Delta-Sigma Modulation in Fractional-N Frequency Synthesis", IEEE Journal of Solid-State Circuits, vol. 28, No. 5, pp. 553-559 May 1993.

* cited by examiner

*Primary Examiner*—Lincoln Donovan
*Assistant Examiner*—Ryan C Jager
(74) *Attorney, Agent, or Firm*—Steven A. Shaw; W. James Brady; Frederick J. Telecky, Jr.

(57) ABSTRACT

Generating an output signal having a frequency of 1/(M+F) of the frequency of the input signal, wherein M represents an integer and F represents a non-zero fraction. Assuming F equals (Q/R) in one embodiment, wherein Q and R are integers, R intermediate signals phase shifted by equal degree (relative to the one with closest phase shift) in one clock period of the input signal are generated. A selection circuit may select one of the intermediate signals in one clock cycle, select the successive signals with increasing phase shift in Q clock cycles, and leave the intermediate signal with the same shift as in the previous clock cycle in the remaining ones of the M clock cycles. A counter counts a change of state in the output of the selection circuit, and generates a pulse representing an edge of the output signal at the time instance when counter counts M.

3 Claims, 3 Drawing Sheets

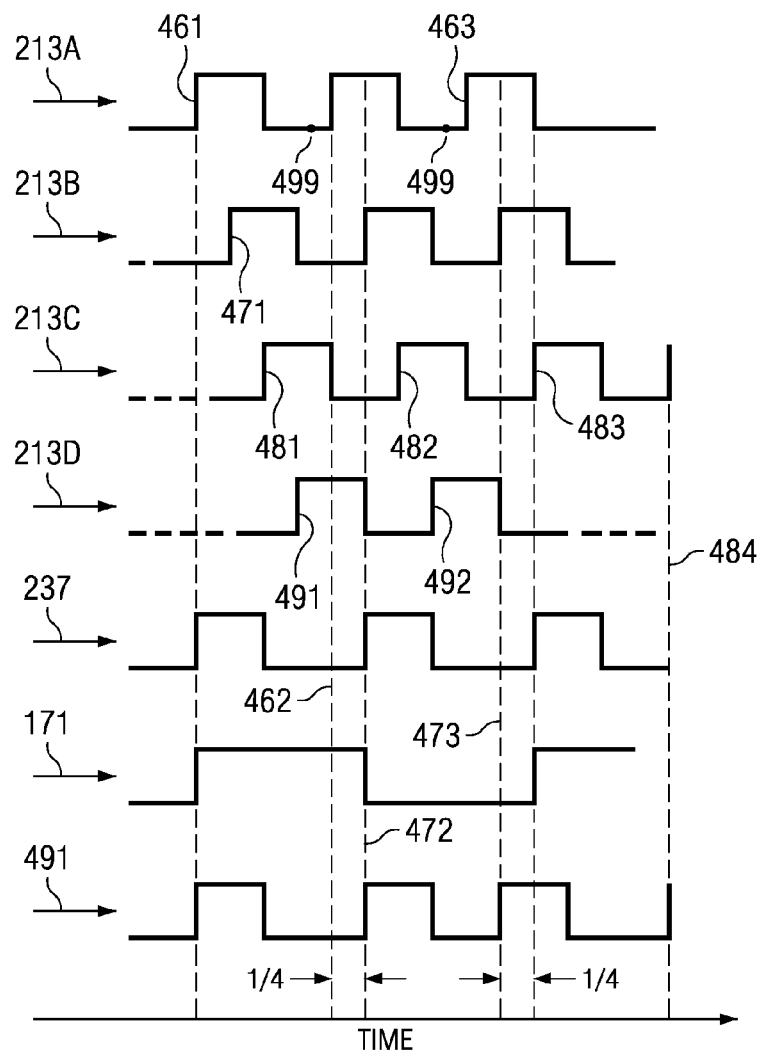
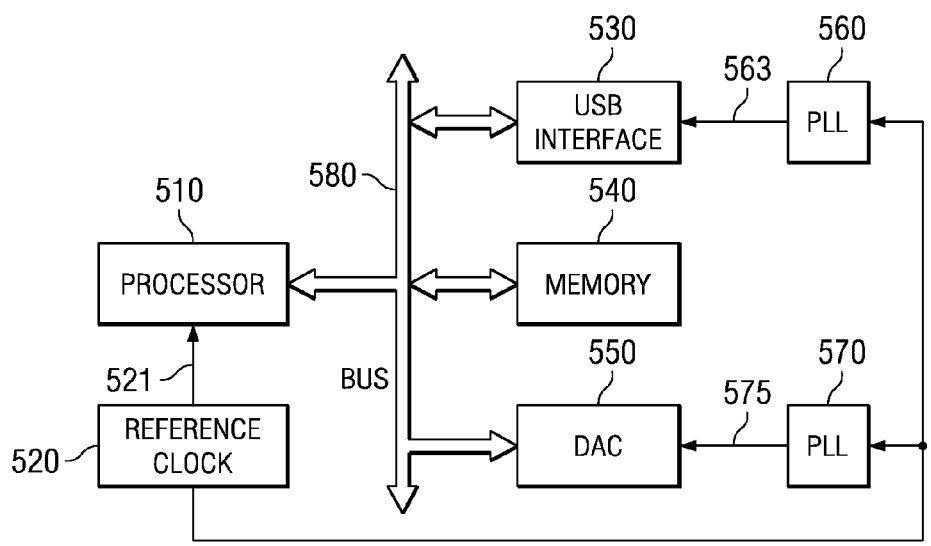
FIG. 4B
FIG. 5

GENERATING AN OUTPUT SIGNAL WITH A FREQUENCY THAT IS A NON-INTEGER FRACTION OF AN INPUT SIGNAL

BACKGROUND

1. Field of the Invention

The present invention relates generally to electronic circuits for dividing a frequency of an input signal, and more specifically to generation an output signal with frequency that is a non-integer fraction of the frequency of an input signal.

2. Related Art

It is often desirable to generate an output signal having a frequency that is a fraction of the frequency in an integrated circuit. For example, an oscillator may be used to generate a high frequency clock signal and it may be desirable to generate several lower frequency clock signals from the high frequency signal. Each of such lower frequency clock signals may be obtained by dividing the high frequency clock signal by a corresponding appropriate divisor.

It is often desired that an input signal be divided by a non-integer fraction. For example, it may be desirable to generate a clock signal having a frequency of 13 MHz from a 480 MHz clock signal, and accordingly it may be desirable to divide the 480 MHz input clock signal with $36^{12}/_{13}$ (i.e., $^{480}/_{13}$, wherein / represents a division operation).

BRIEF DESCRIPTION OF THE DRAWINGS

The present invention will be described with reference to the following accompanying drawings, which are described briefly below.

FIG. 4B is a timing diagram illustrating the operation of a controller in one embodiment.

FIG. 5 is a block diagram which illustrating the details of an example system in which several aspects of the present invention can be implemented.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention enables an output signal to be generated from an input signal, with the output signal having a frequency of 1/(M+F) of the frequency of the input signal, wherein M represents an integer and F represents a fraction. Such a feature may be obtained by generating multiple phase shifted signals from the input signal, with two signals having a phase difference of F times the time period of the input signal. A selection circuit provides the first one of the two signals in a first one of each M-clock cycles of the input signal, the phase shifted signal in the last of M-cycles and any of the phase shifted in the remaining ones of the M-cycles. A counter counts the number of change of states (e.g., a rising edge or level) on the output of the selection circuit, and an edge of the output signal is presented for count equaling M.

In one embodiment, F is represented as (Q/R), wherein Q and R are integers, and R intermediate signals phase shifted by equal degree (relative to the one with closest phase shift) in one clock period of the input signal are generated. The desired aggregate phase shift between the first intermediate signal and the last intermediate signal (in M cycles of the input signal) is spread across multiple clock cycles in between. In such a scenario, the intermediate signal with the next amount of phase shift is selected in Q of the M cycles, and the intermediate signal with the same phase shift as in the previous cycle is used for the remaining cycles.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. EXAMPLE COMPONENT

Figure 1:
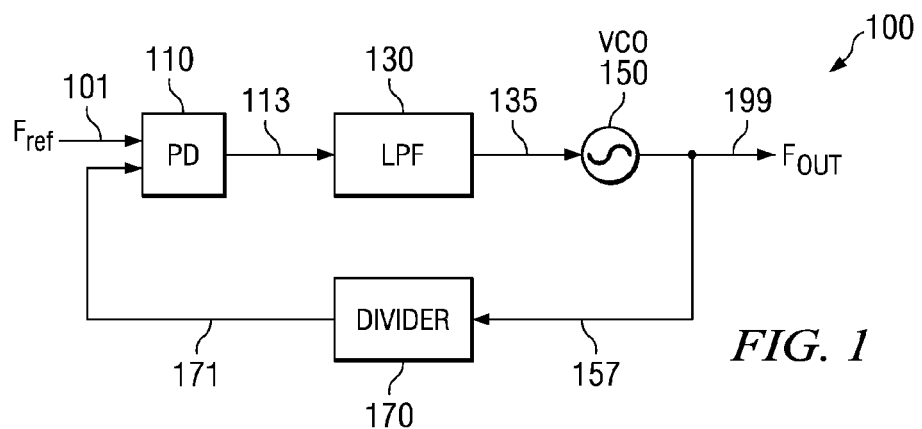
FIG. 1 is block diagram of the internals of a phase lock loop (PLL) illustrating an example component in which several aspects of the present invention can be implemented.

FIG. 1 is block diagram of a phase lock loop (PLL) illustrating an example component in which several aspects of the present invention can be implemented. PLL 100 is shown containing phase detector 110, low pass filter (LPF) 130, voltage control oscillator (VCO) 150 and divider 170. Each block is described below in further detail.

Phase detector (PD) 110 generates a signal on terminal 113 having a strength (voltage, charge, etc.) proportionate to the difference in phase/frequency of the signals respectively received on input terminals 101 and 171. PD 110 is shown receiving a reference signal having a reference frequency (Fref) on terminal 101 and a feedback signal on terminal 171. PD 110 may be implemented using a multiplier which generates a DC component proportional to the phase/frequency difference of the input signals and other higher frequency components (harmonics of the input signals) as is well known in the relevant arts.

Low pass filter 130 receives the output signal from PD 110 (on path 113) and filters high frequency components to provide a stable DC (component) voltage (on path 135) representing the difference in phase between input signal 101 and feedback signal 171. Filter 130 may also remove noise, jitter, etc., present in the output signal 113. The DC component is provided to VCO 150.

VCO 150 generates a frequency Fout on terminal 199 such that Fout=Fosc(+/−) Fv, wherein Fosc represents a constant center frequency of VCO 150, and Fv represents a change effected to Fosc proportionate to the DC voltage received on path 135.

Divider 170 receives Fout signal as input on path 157 and generate a feedback signal on path 171 such that Fout/Ffeedback=N. Feedback signal on path 171 is provided to PD 110. As a result, Fout (VCO output) on terminal 199 operates to stabilize at a frequency N*Fref such that the output (DC component) of PD 110 is at zero.

For example, if Fout is less than N*Freq, DC component of PD 110 will be positive and hence Fv component of VCO 150 output increases till the Fout=N*Fref. On the other hand, if Fout is greater than N*Freq, DC component of PD 110 will be negative causing a reduction in Fv component till the Fout=N*Fref.

Due to Above operation, the feed back loop operates to lock the phase of the feedback signal to the reference signal received on path 101. Such operation is advantageously used to generate various different frequencies from a reference frequency Fref by changing the division factor N.

When N is an integer, the divider 170 is implemented using counters (integer divider) such as synchronous counter. For example, as well known in the relevant art, a counter implemented to count N, provided a rising/falling edge at every N number of corresponding rising/falling edges of the input signal. Thus representing a frequency 1/N of the frequency of the corresponding input signal.

However, when N is a non-integer value as noted above, different approaches may be required. Various aspects of the present invention enable output signals to be generated when N equals a non-integer, as described below in further detail.

3. Fractional Division for R Phases

Figure 2:
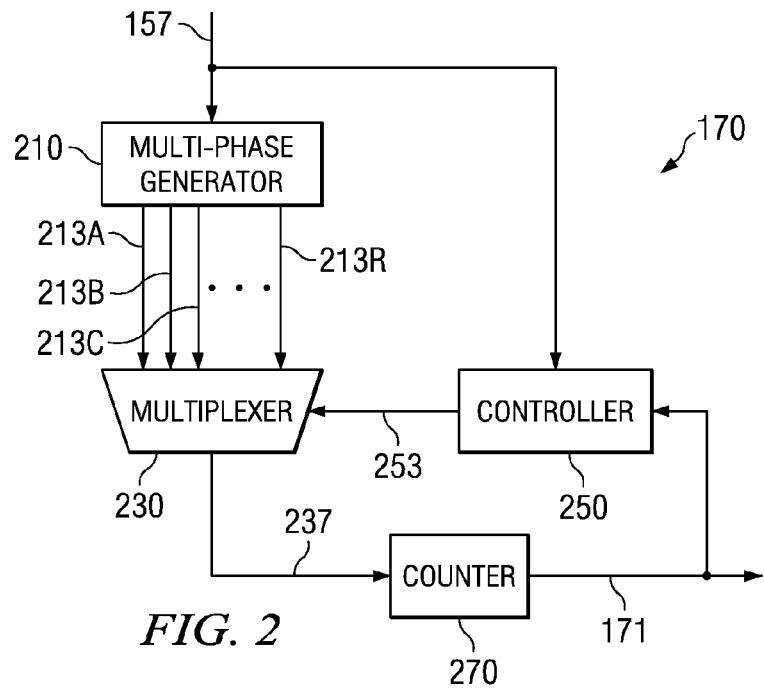
FIG. 2 is a block diagram illustrating the manner in which a division by a non-integer fraction can be obtained according to an aspect of present invention.

FIG. 2 is a block diagram illustrating the division of an input signal by a non-integer fraction according to an aspect of the present invention. Divider 170 is shown containing multi-phase generator 210, multiplexer 230, controller 250 and counter 270. Each block is described below in further detail.

Counter 270 generates successive rising edges for every M (representing an integer) rising (can be falling instead) edges received at the input path 237 and thus operates to divide the signal received on path 237 by integer M. In general, counter 270 counts the state changes (e.g., a rising edge) up to M, and have the count reset upon reaching M. The reset also indicates the time instance at which the transition (e.g., rising edge) of the output signal is to be presented. The desired duty cycle (percentage of high logic level versus the period of the desired output signal) can be obtained by using additional circuitry (e.g., multi-vibrators) as will be apparent to one skilled in the relevant arts. As described in sections below, the effect of such operation is to divide the input signal received on path 157 by M+F, wherein F represents a fraction. The implementation of counter 270 will be apparent to one skilled in the relevant arts (e.g., using synchronous counters) based on the disclosure provided herein.

Multi-phase generator 210 generates R output signals (R intermediate signals) each with different phase, but with the same frequency as the signal received on path 157. The R output signals may be phased out equally by 1/R of the period of signal 157. Thus, the phase difference between signal 213A and 213B is 1/R and phase difference between 213B and 213C is 1/R so on. R generally needs to be chosen to equal the denominator of fractional part F noted above. An embodiment of multi-phase generator 210 is described with reference to FIGS. 3A and 3B.

Continuing with reference to FIG. 2, controller 250 generates control values (V) on path 253 to attain the desired division by (M+Q/R), wherein R is an integer as described above, M and Q are also integers determined by the desired non-integer fraction. Broadly, the values are generated by recognizing that every Mth signal needs to be phase shifted by Q/R (of T) in comparison to the first signal in M cycles of input signal 157 to achieve a division by (M+Q/R).

Multiplexer 230 provides one of the inputs 213A-213R as output on path 237 based on the control value received from controller 250 on path 253. The combination of multiplexer 230 and controller 250 operates to select the specific ones of the phase shifted signals 213A-213R to cause a division by non-integer fraction, and thus the combination is referred to as a selection circuit. Various embodiments of selection circuit will be apparent to one skilled in the relevant arts by reading the disclosure provided herein and such embodiments are contemplated to be covered by various aspects of the present invention.

The details of an example embodiment of selection circuit are provided below with respect to FIG. 4. However the operation can be understood in relation to the details of a corresponding embodiment of multi-phase generator, and accordingly the description is continued with an example of a multi-phase generator.

4. Multi-Phase Generator

Figure 3A:
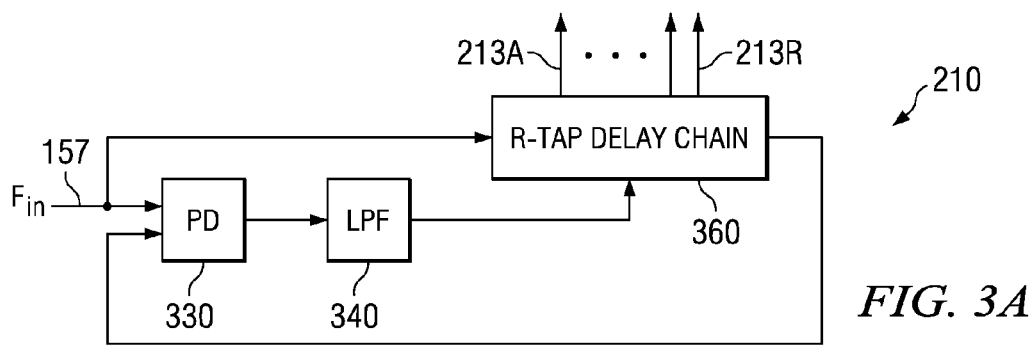
FIG. 3A is a block diagram which illustrating the details of a multi-phase generator in one embodiment.

FIG. 3A is a block diagram of multi-phase generator 210 generating R intermediate signals (213A-213R) of an input signal in one embodiment. The block diagram is shown containing phase detector 330, low pass filter 340 and R-tap delay chain 360. Each component is described below in further detail.

Figure 3B:
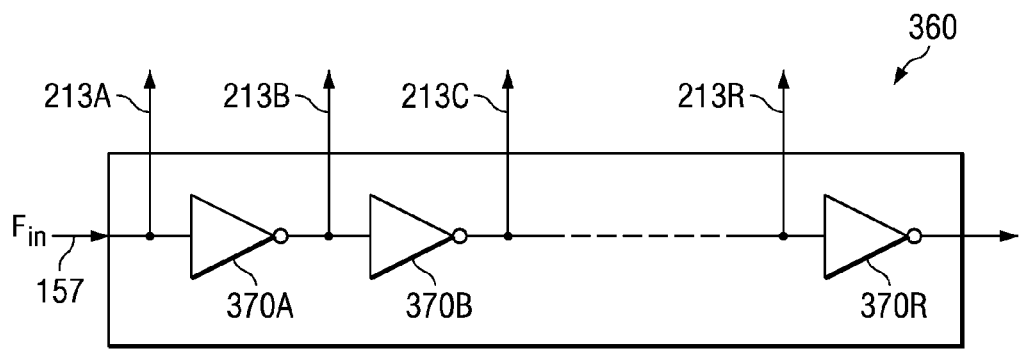
FIG. 3B is a block diagram illustrating the details of a delay chain generating phase delayed intermediate signals in an embodiment.

Input signal 157 is shown provided to R-tap delay chain 360 and phase detector 330. Delay chain 360 contains delay elements 370A-370R in series (as shown in FIG. 3B), with each delay element introducing a delay of T/R, wherein T represents the time period of input signal 157. Each delay element propagates the input signal to the corresponding output with such a finite known delay, and thus the delay circuit of FIG. 3B provides an aggregate delay equaling the sum of delays (which should ideally equal T).

The combination of phase detector 330 and LPF 340 operates similar to the combination phase detectors 10 and LPF 130 in FIG. 1. A voltage proportional to the difference in the phase is provided to delay chain 360 and the delay of each delay element is adjusted to produce a total delay of one cycle of signal 157 (duration T). The output from each delay element is provided as R intermediate signals of input signal 157 as shown.

It may be readily appreciated that the multi-phase generator 210 of FIG. 3A operates at a high frequency (corresponding to the frequency of input signal 157) and contains a single pole, thus the stability and bandwidth (due to the single pole and high frequency of operation) of the PLL 100 is not degraded due to the presence multi-phase generator 210 in the loop of FIG. 1. However, various other alternative embodiments can be used in implementing multi-phase generators, as will be apparent to one skilled in the relevant arts by reading the disclosure provided herein.

5. Selection Circuit

Figure 4A:
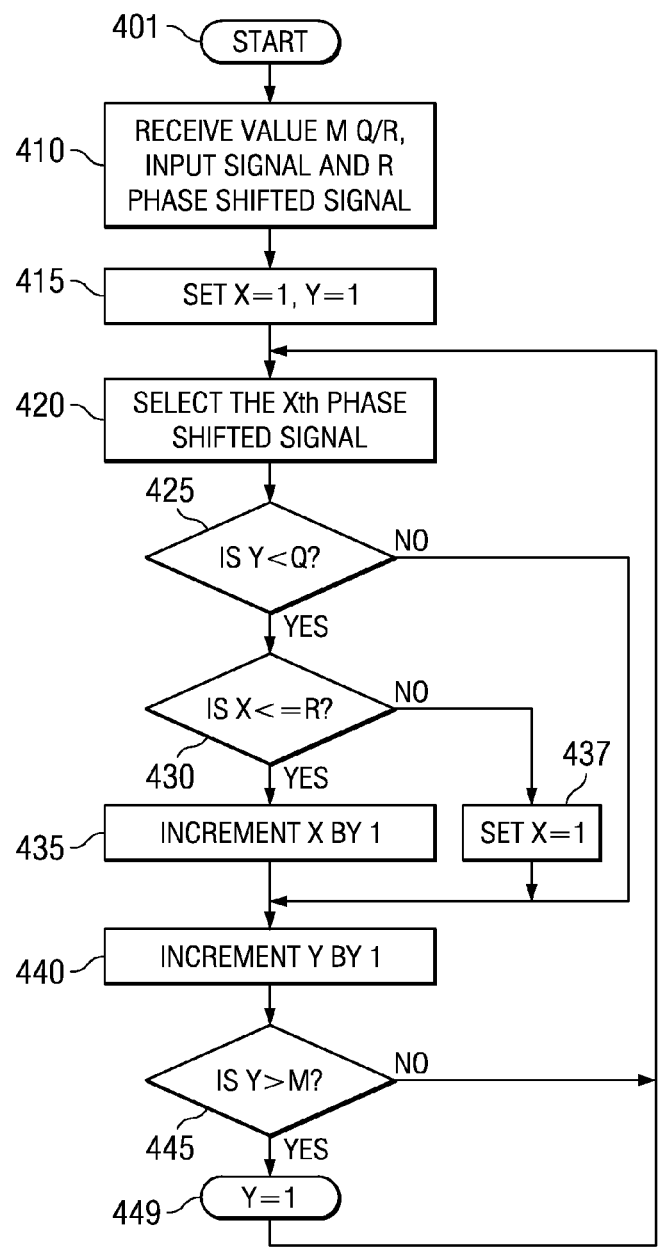
FIG. 4A is a flow chart illustrating the operation of a controller to divide a signal by a non-integer fraction in one embodiment.

FIG. 4A is a flowchart illustrating the manner in which phase shifted signals are selected in each cycle to cause a division by non-integer fraction in an embodiment of the present invention. The flowchart is illustrated with reference to FIG. 2 merely for illustration, however it may be implemented in other environment as well, as will be apparent to one skilled in the relevant art. The flow chart start in step 401 in which control passes to step 410.

In step 410, the non-integer fraction M Q/R, input signal and R phase shifted signal are received by the selection circuit. The value Q/R may be received in the form of a fraction F and the corresponding Q/R may be determined. Alternatively, the values M, Q, and R may be provided as an input to controller 250. Controller 250 may store the received value in a memory for further reference. In step 415, controller 250 sets an initial value for each of variables X and Y to value 1.

In step 420, the selection circuit selects the Xth phase shifted signal in a present clock cycle of the input signal 157.

Controller 250 may provide X as the value on path 253 to cause such a selection. The selected signal is provided/switched (multiplexer 230 may switch Xth intermediate signal to output terminal 237) as input to counter 270 at a predefined time point in the present clock cycle. For example, the selected signal may be provided at every falling edge of the input signal, or slightly ahead of rising edge of the input signal.

In step 425, controller 250 determines if the value of Y is less than Q. Controller 250 may compare the pre stored value of Q with the present value of Y. If the Value of Y is less than Q, control passes to step 430, else to step 440.

In step 430, controller 250 checks if the value of X is less than or equal to R. If the value of X is less than R, control passes to step 435 in which controller 250 increments the value of X by 1. If the value of X is greater than R, control passes to step 437 in which the controller 250 sets the value X to 1 (a cyclic increment). As a result the value of X is incremented (cyclically) within the available number of R phase shifted (intermediate) signals 213A-213R.

In step 440, controller 250 increment Y by a value 1. The variable Y enables the controller 250 to monitor the number of cycles (of input signal 157) being counted. The controller 250 may be provided with the input signal 157 to determine start/end of each cycle. As a result, phase shift of 1/R is incremented (distribution of total phase Q/R) in each cycle up to Q cycles there by providing a sum of Q*1/R phase shift at the end of Q cycles.

In step 445, controller 250 checks if the value of Y is greater than M. If Y is greater than M, control passes to step 449, else to step 420. In step 449, controller 250 resets Y to 1 to indicate the end of counter cycle/start of new count cycle (of M cycles) for counter 270. Control again passes to step 420.

As the total required shift of (Q/R*T) is distributed in the first Q (of the M) cycles, jitter may be reduced. The shift may be distributed more evenly in the M-cycles to further reduce jitter. However, several of such alternative approach may be used to achieve Q/R phase shift without departing from the scope and spirit of the present invention.

The selection of intermediate signals described above is illustrated with reference to FIG. 4B below.

6. Timing Diagram

FIG. 4B is a timing diagram illustrating the manner in which controller 250 can be operated to generate an output signal by dividing an input signal by M+Q/R, wherein M, Q and R are integers. The first example is provided assuming R=4, Q=1 and M=2 such that a division by 2¼ is desired, and also that the selection (switching from Kth intermediate signal K+1th intermediate signal) is performed after ¾ of clock cycle of input signal 157. Timing diagram is shown containing intermediate signal 213A-213D, signal 237, feedback signal 171 and signal 491. Each signal is described below in further detail.

Phase shifted signals 213A-213D are shown with a relative successive phase difference of 1/R (in this case R=4). Phase shifted signal 213A equals input signal 157 and thus controller 250 provides the control value on path 253 soon after ¾ of the clock period in each clock cycle, shown as points 499.

Signal 237 is shown containing rising edge of signal 213A starting at time point 461, rising edge of signal 213B starting at time point 472, and rising edge of 213C starting at time point 483. From this pattern, it may be appreciated that the next phase shifted (intermediate) signal is selected every alternate clock signal of input signal 157, corresponding to Q=1 and M=2. Thus, signal 213A would be selected again in the fifth clock cycle (since R=4).

Signal 171 representing the desired output signal is shown with successive rising edges when each time counter counts 2 (i.e., M=2). That is, after 2 rising edges are received on path 237, a rising edge is generated on signal 171 as shown at time instances 461 and 483. It is assumed that any desired duty cycle (e.g., 50% as shown) is attained by any required additional circuitry. Accordingly, signal 171 is shown changing the state for every two counts (at alternate rising edges of signal 237) indicating the division by 2¼.

Signal 491 merely shows the signal on path 237 when M=3, Q=1 and R=4. As may be appreciated, the phase shift occurs once in every 3 cycles and remains at that phase for the remaining 2 cycles. In response (not shown), signal 171 would have a rising edge (at 461, 473) upon the occurrence of 3 rising edges on signal 491.

It may be appreciated that division by non-integer fraction in the PLL 100 of FIG. 1 can be achieved (as described above with examples) without substantial constraints being placed on the loop-dynamics of the main loop (of FIG. 1). For example, the embodiments of above can be implemented to not introduce additional spurs or noise that may be required to be filtered by the PLL loop.

From the above, it may be appreciated that PLL 100 of FIG. 1 generates a clock signal divided by non-integer fraction. The above-described PLL 100 can be implemented in various systems, as described below with an example.

7. EXAMPLE SYSTEM

FIG. 5 is a block diagram of a data processing system illustrating an example system (or device) in which several aspects of the present invention may be implemented. The data processing system is shown containing processor 510, reference clock 520, USB interface 530, memory 540, DAC 550, and PLLs 560 and 570. Each block is described below in further detail.

DAC 550 converts digital data received on bus 580 into corresponding analog signals (not shown). DAC 550 is designed to operate (conversion rate) at a DAC frequency based on end application to which the analog signal is provided. The desired DAC frequency is received on path 575. The received digital data may represent a audio/video data. The analog signal is provided (not shown) to corresponding audio/video device for reproduction.

USB interface 530 provide an external interface for data transmission and reception according to the USB standard well known in the relevant art. The received data is stored in memory 540. USB interface 530 operates using a USB clock on path 563 provided at a predefined frequency. In one embodiment, the USB clock has a frequency of 480 Mhz. In general, USB interface 530 and DAC 550 represent example components which operate based on the divided clock signal received from the respective PLLs 560 and 570.

Processor 510 interact with DAC 550, USB interface 530, memory 540 through bus 580. Processor 510 may receive data from memory 540 or USB interfaces 530 and performs a desired operation to generate a bit stream. The generated bit stream is provided to DAC 550 for converting in to analog signal. Processor 510 receives clock signal on path 521 and performs the operation based on the received clock signal. In one embodiment the processor 510 is designed to operate at 13 MHz.

Reference clock 520 generate a clock signal with a desired clock frequency. In one embodiment, the frequency equals 13 MHz noted above, and thus the signal is being provided directly to processor 510.

PLLs 560 and 570 receives the reference clock signal and respectively generate USB clock 563 and DAC clock 575. The features described above can be used in implementing each of the PLLs 560 and 570. In an embodiment, each PLL 560 and 570 is implemented as PLL 100 shown in FIG. 1. PLL 560 generates 480 MHz signal from 13 MHz signal by setting M=36, Q=12 and R=13 per the description provided above.

It may thus be appreciated that an output signal can be generated with a non-integer fraction of a frequency of an input signal using the approaches described above. The implementations can be provided with reduced jitter and power consumption due to the operation at higher loop bandwidth.

8. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A device comprising:
a clock circuit generating a reference signal;
a component generating a plurality of digital values;
a processor processing said plurality of digital values; and
a phase lock loop (PLL) receiving said reference signal and generating an external signal which drives operation of one of said component and said processor, said PLL containing a divider which receives said external signal as an input signal and generates a divided signal as an output signal, said output signal having a first frequency and said input signal having a second frequency, wherein said first frequency equals a non-integer fraction represented by (M+F) of said second frequency, wherein M represents an integer and F represents a fraction, said divider comprising:
a multi-phase generator circuit generating a plurality of intermediate signals from said input signal, said plurality of intermediate signals which are relatively phase shifted with respect to each other;
a selection circuit selecting as a selection output a first intermediate signal in a first cycle of said input signal, a second intermediate signal in a Mth cycle of said input signal, and any of said plurality of intermediate signals in the remaining ones of the M cycles of said input signal, said selection circuit comprising:
a multiplexer which receives said plurality of intermediate signals and selects one of said plurality of intermediate signals in a corresponding one of said plurality of M cycles according to a corresponding control value;
a controller receiving said input signal and providing said control values in said M cycles of said input signal, wherein said selection circuit spreads said phase shift of F times of said time period in a plurality of said M cycles and selects first Q of said plurality of intermediate signals which are successively phase shifted by 1/Rth of said time period and selects the same signal as that selected in Qth cycle, thereafter in the remaining (M-Q) cycles,
wherein said first intermediate signal and said second intermediate signal are contained in said plurality of intermediate signals, wherein said second intermediate signal is phase shifted by a magnitude of F times the time period of said input signal in comparison to said first intermediate signal and F equals Q/R. wherein Q and R represent integers, wherein each of said plurality of intermediate signals are equally phase shifted by 1/Rth of said time period; and
a counter counting a number of state changes on said selection output, wherein an edge of said output signal is generated every instance said counter counts M cycles in said selection output.

2. The device of claim 1 wherein said PLL further comprises:
a phase detector which compares a phase of said output signal with said reference signal and generating a signal which causes the phase of said external signal to be adjusted such that the phase of said output signal is aligned with the phase of said reference signal.

3. The device of claim 1 wherein each of said plurality of intermediate signals has the same frequency as said input signal such that said multi-phase generator circuit operates at a high frequency equaling the frequency of said input signal.

* * * * *